US010630041B2

(12) United States Patent
Hemenway et al.

(10) Patent No.: US 10,630,041 B2
(45) Date of Patent: Apr. 21, 2020

(54) BEAM OFFSET PLATE FOR OPTICALLY OFFSETTING ONE OR MORE LASER BEAMS

(71) Applicant: nLIGHT, Inc., Vancouver, WA (US)

(72) Inventors: David Martin Hemenway, Beaverton, OR (US); David C. Dawson, Brush Prairie, WA (US); Wolfram Urbanek, Camas, WA (US)

(73) Assignee: NLIGHT, INC., Vancouver, WA (US)

( * ) Notice: Subject to any disclaimer, the term of this patent is extended or adjusted under 35 U.S.C. 154(b) by 0 days.

(21) Appl. No.: 15/937,584

(22) Filed: Mar. 27, 2018

(65) Prior Publication Data

US 2018/0278008 A1    Sep. 27, 2018

Related U.S. Application Data

(60) Provisional application No. 62/477,380, filed on Mar. 27, 2017.

(51) Int. Cl.
*H01S 3/0941* (2006.01)
*H01S 5/40* (2006.01)
(Continued)

(52) U.S. Cl.
CPC .......... *H01S 3/0941* (2013.01); *G02B 6/4206* (2013.01); *H01S 3/06704* (2013.01); *H01S 5/005* (2013.01); *H01S 5/0071* (2013.01); *H01S 5/02248* (2013.01); *H01S 5/02288* (2013.01); *H01S 5/02469* (2013.01); *H01S 5/4012* (2013.01); *H01S 5/4025* (2013.01); *H01S 5/4031* (2013.01); *H01S 5/4075* (2013.01)

(58) Field of Classification Search
CPC ........ H01S 5/022; H01S 5/00; H01S 3/06704; H01S 5/02469; H01S 5/40; H01S 3/067; H01S 5/0071; H01S 5/024; H01S 5/02288
See application file for complete search history.

(56) References Cited

U.S. PATENT DOCUMENTS 5,629,791 A * 5/1997 Harrigan ................ G02B 27/09
359/223.1
5,986,794 A 11/1999 Krause et al.
(Continued)

FOREIGN PATENT DOCUMENTS

| CN | 101221288 | 11/2010 |
| CN | 103278928 | 9/2013 |
| CN | 203811854 | 9/2014 |

OTHER PUBLICATIONS

Partial International Search Report for PCT/US2018/024635, dated Jul. 3, 2018, 13 pages.
(Continued)

*Primary Examiner* — Tuan N Nguyen
(74) *Attorney, Agent, or Firm* — Michelle Craig

(57) ABSTRACT

A laser diode assembly, comprising a plurality of laser diodes each configured to emit respective ones of a plurality of laser beams along parallel and nonoverlapping optical axes and a first beam offset plate (BOP) configured to receive a first of the laser beams on a first input surface, the first laser beam having a first input optical axis, the first BOP configured to transmit a first output laser beam that has a first vertical offset from the first input optical axis.

17 Claims, 13 Drawing Sheets

(51) Int. Cl.
  *H01S 5/022* (2006.01)
  *H01S 3/067* (2006.01)
  *H01S 5/00* (2006.01)
  *G02B 6/42* (2006.01)
  *H01S 5/024* (2006.01)

(56) References Cited

U.S. PATENT DOCUMENTS

| | | | |
|---|---|---|---|
| 6,115,185 A * | 9/2000 | Du | G02B 27/09 359/627 |
| 6,462,883 B1 | 10/2002 | Wang et al. | |
| 8,427,749 B2 * | 4/2013 | Du | H01S 5/4012 359/618 |
| 2002/0171941 A1 | 11/2002 | Okada | |
| 2004/0252388 A1 * | 12/2004 | Yamanaka | G02B 27/0905 359/834 |
| 2009/0245315 A1 * | 10/2009 | Faybishenko | G02B 6/4206 372/50.12 |
| 2010/0309936 A1 * | 12/2010 | Lefort | H01S 3/113 372/11 |
| 2015/0280404 A1 * | 10/2015 | Kasai | G02B 27/10 385/33 |
| 2016/0252679 A1 * | 9/2016 | Sakamoto | G02B 5/04 385/24 |

OTHER PUBLICATIONS

European Patent Office (Rijswijk); International Search Report and Written Opinion PCT/US2018/024635, dated Oct. 15, 2018; 20 pages.

* cited by examiner

| Thickness | Fused Silica | N-BK7 | N-LaF21 |
|---|---|---|---|
| 1 | 56.5 | 55.5 | 49.5 |
| 2 | 35.5 | 33.5 | 27.5 |
| 3 | 25.5 | 24 | 21 |
| 4 | 20 | 18.5 | 14.5 |

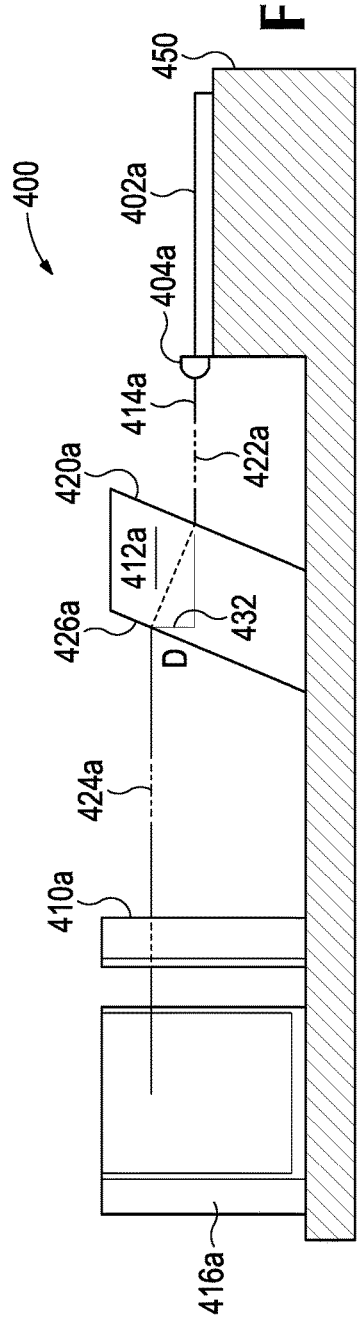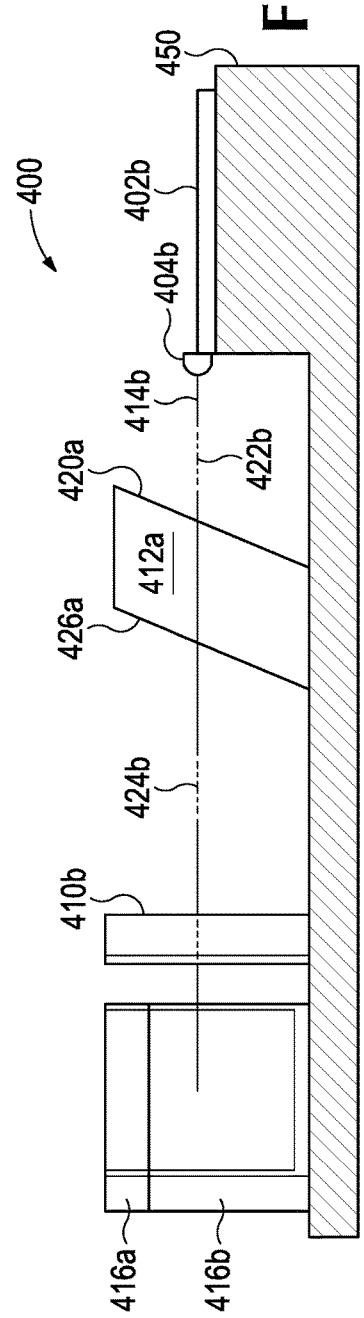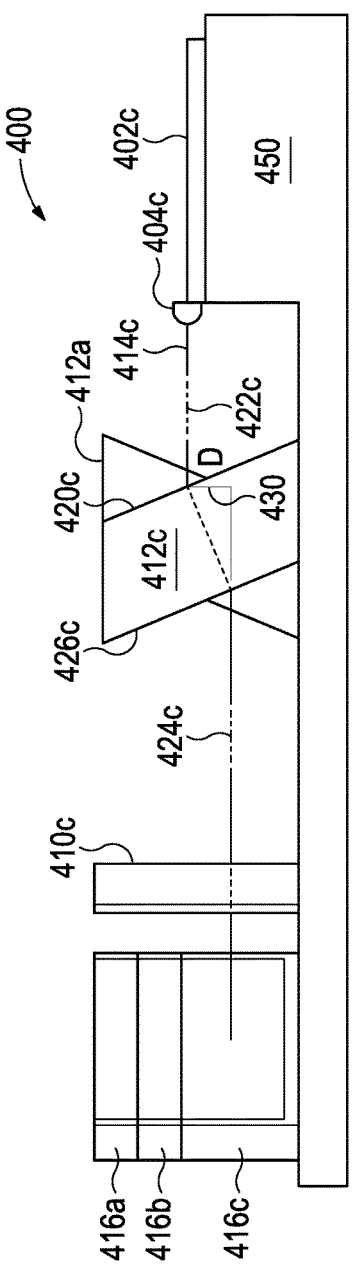

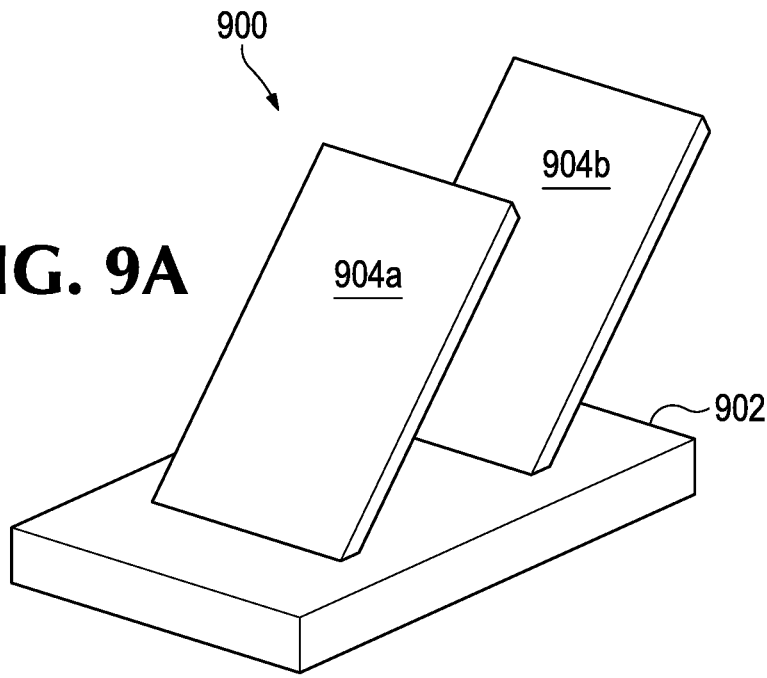
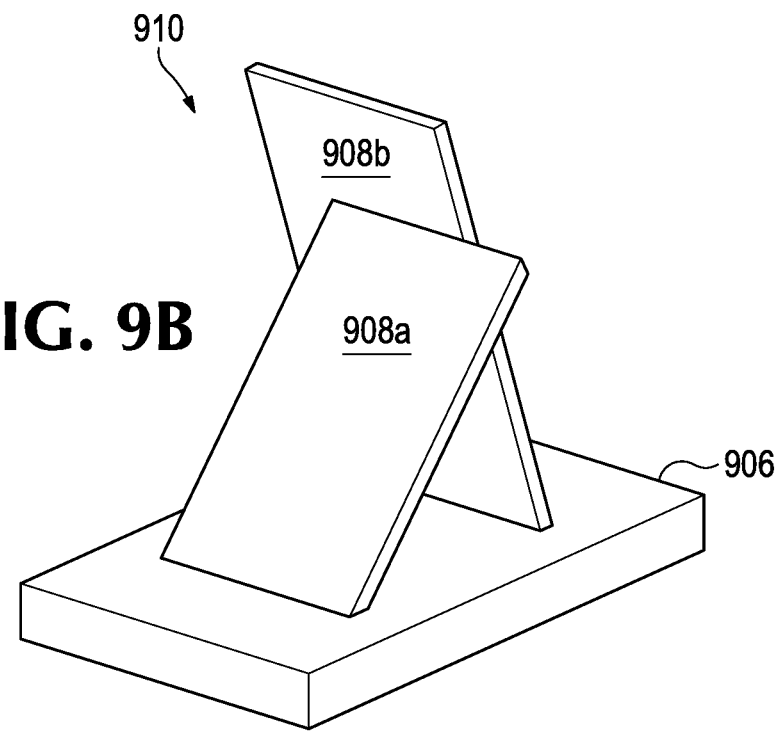

BEAM OFFSET PLATE FOR OPTICALLY OFFSETTING ONE OR MORE LASER BEAMS

CROSS-REFERENCE TO RELATED APPLICATIONS

The present application claims priority from U.S. Provisional Patent application, Ser. No. 62/477,380, filed Mar. 27, 2017, which is incorporated herein in its entirety by reference.

TECHNICAL FIELD

The technology disclosed herein relates to laser beam combining optics in fiber lasers.

BACKGROUND

Laser diodes have been developed that produce substantial output powers that make possible a variety of applications. To further increase available optical power, laser diode assemblies have been produced in which output beams from a plurality of laser diodes are combined in fiber laser systems. Such laser diode assemblies are sometimes referred to as laser diode packages. Typically, laser diode packages are arranged to stack beams emitted from the laser diodes in a fast axis. A variety of optics are included in the diode packages to collimate, direct, and focus the beams onto an input surface of a fiber that will transmit the combined beams to a processing apparatus. There is a drive in the laser industry to constantly improve the brightness and minimize losses in laser diode packages used to pump continuous wave fiber lasers (CWFL) and/or directly process material. Total available power can be increased by increasing the number of laser diodes in the diode package. However, the laser diodes used to form the beam stack must be spaced apart; thus, the number of beams in a beam stack delivered to an input surface of fiber is limited by the size of the beam stack. Therefore, the number of beams that can be practically combined is limited. Diode packages utilize different methods to physically separate the beams in the fast axis of the laser diode. In one example, laser diodes are arranged in a stair-step pattern and collimated beams from the lasers diodes are formed into a beam stack. One problem with the stair-step architecture is that laser diodes individually secured to separate stair-steps of a stepped diode mount have increasing step heights and thus correspondingly increased thermal paths. The laser diodes operate at increasingly higher temperature as the thermal path increases. Temperature negatively affects several laser diode parameters, the two most important of which are the laser diode power and laser diode reliability. Thus, the stairstep architecture in some laser diode packages reduces power and reliability. Alternative approaches are needed.

SUMMARY

Disclosed herein is an optical system for steering laser beams. One general aspect includes a laser diode assembly, including: a plurality of laser diodes each configured to emit respective ones of a plurality of laser beams along parallel and nonoverlapping optical axes; and a first beam offset plate (BOP) configured to receive a first of the laser beams on a first input surface, the first laser beam having a first input optical axis, the first BOP configured to transmit a first output laser beam that has a first vertical offset from the first input optical axis. Other embodiments of this aspect include corresponding optical systems configured to perform like actions.

Implementations may include one or more of the following features. The laser beam assembly including a second BOP configured to receive a second of the laser beams on a second input surface, the second laser beam having a second input optical axis, the second BOP configured to transmit a second output laser beam that has a second vertical offset from the second input optical axis. The laser diode assembly where the first vertical offset of the first output laser beam is above the first input optical axis and where the second vertical offset of the second output laser beam is above the second input optical axis. The laser diode assembly where the first vertical offset of the first output laser beam is below the first input optical axis and where the second vertical offset of the second output laser beam is below the second input optical axis. The laser diode assembly where the first vertical offset of the first output laser beam is below the first input optical axis and where the second vertical offset of the second output laser beam is above the second input optical axis. The laser diode assembly where the first BOP or the second BOP or a combination thereof are disposed adjacent to one or more optical elements configured to direct one or more of the laser beams along one or more light paths towards an input surface of an optical waveguide, free-space optics, second laser diode assembly, a different optical system or a combination thereof. The laser diode assembly where the optical waveguide is an optical fiber. The laser diode assembly where the plurality of laser diodes are disposed on a first plane and the first BOP or the second BOP or a combination thereof are disposed on a second plane, where the first plane and the second plane are at different vertical heights. The laser diode assembly where the plurality of laser diodes and the first BOP or the second BOP or a combination thereof are disposed on a same plane. The laser diode assembly further including a fast axis collimating (FAC) lens disposed at an output FACet of each of the plurality of laser diodes and a slow axis collimating (SAC) lens disposed downstream from each FAC lens and where the first BOP is disposed between a first FAC lens and a first SAC lens and where the second BOP is disposed between a second FAC lens and a second SAC lens. The laser diode assembly where a first BOP, first FAC lens and first SAC lens subassembly are disposed adjacent to and parallel with a second BOP, second FAC lens and second SAC lens subassembly. The laser diode assembly where the first BOP or the second BOP or a combination thereof includes an optically transparent substrate. The laser diode assembly where the optically transparent substrate is fused silica, n-bk7 or n-laf21. The laser diode assembly where the first BOP or the second BOP or a combination thereof includes an index of refraction between 1.4 and 1.9. The laser diode assembly where the first BOP or the second BOP or a combination thereof includes an abbe value between 85 and 25. The laser diode assembly where the first vertical offset and the second vertical offset are the same. The laser diode assembly where the first vertical offset and the second vertical offset are different. The laser diode assembly where the first BOP or the second BOP, or a combination thereof is coupled to a slow axis collimating (SAC) lens. The laser diode assembly where the first and second BOPs are formed from a single optical component. The laser diode assembly where the first and second BOPs are optimized so that the angle of incidence of each BOP is Brewster's Angle, omitting the need for anti-reflection coatings. The laser diode assembly where the first and second BOPs are fabricated from multiple smaller optics assembled into a single optic. The laser diode assembly where the first and second BOPs are fabricated by molding, machining, or polishing a monolithic source substrate. The laser diode assembly where the first BOP is a tilted parallel plate. Implementations of the described techniques may include hardware, a method or process, or computer software on a computer-accessible medium.

One general aspect includes a laser diode assembly, including: a plurality of laser diodes arranged in a two-dimensional array each configured to emit respective ones of a plurality of laser beams along parallel optical axes that overlap in the vertical direction; a first beam offset plate (BOP) configured to receive and vertically offset a first of the laser beams output by a first of the laser diodes. Other embodiments of this aspect include corresponding optical systems configured to perform the actions of the methods.

Implementations may include one or more of the following features. The laser beam assembly further including a second BOP configured to receive the first laser beam output from the first BOP and a second laser beam output by a second of the laser diodes and to vertically offset both the first laser beam and the second laser beam. The laser diode assembly further including a fast axis collimating (FAC) lens disposed at an output facet of each of the plurality of laser diodes and a slow axis collimating (SAC) lens disposed downstream from each FAC lens, where the first BOP is disposed downstream of a first of the SAC lenses and where the second BOP is disposed downstream of a second of the SAC lenses. Implementations of the described techniques may include hardware, a method or process, or computer software on a computer-accessible medium.

BRIEF DESCRIPTION OF THE DRAWINGS

The accompanying drawings, wherein like reference numerals represent like elements, are incorporated in and constitute a part of this specification and, together with the description, explain the advantages and principles of the presently disclosed technology. In the drawings.

FIG. 4C is a cutaway view illustrating a side profile of an optical beam through a beam offset plate in a representative laser diode package according to various embodiments;

FIG. 4D is a cutaway view illustrating a side profile of an optical beam in a beam offset plate that is not transmitted through the beam offset plate in a representative laser diode package according to various embodiments;

FIG. 4E is a cutaway view illustrating a side profile of an optical beam through a beam offset plate in a representative laser diode package according to various embodiments;

FIG. 9A illustrates an example monolithic set of beam offset plates according to various embodiments; and FIG. 9B illustrates an example monolithic set of beam offset plates according to various embodiments.

TERMINOLOGY

Figure 1A:
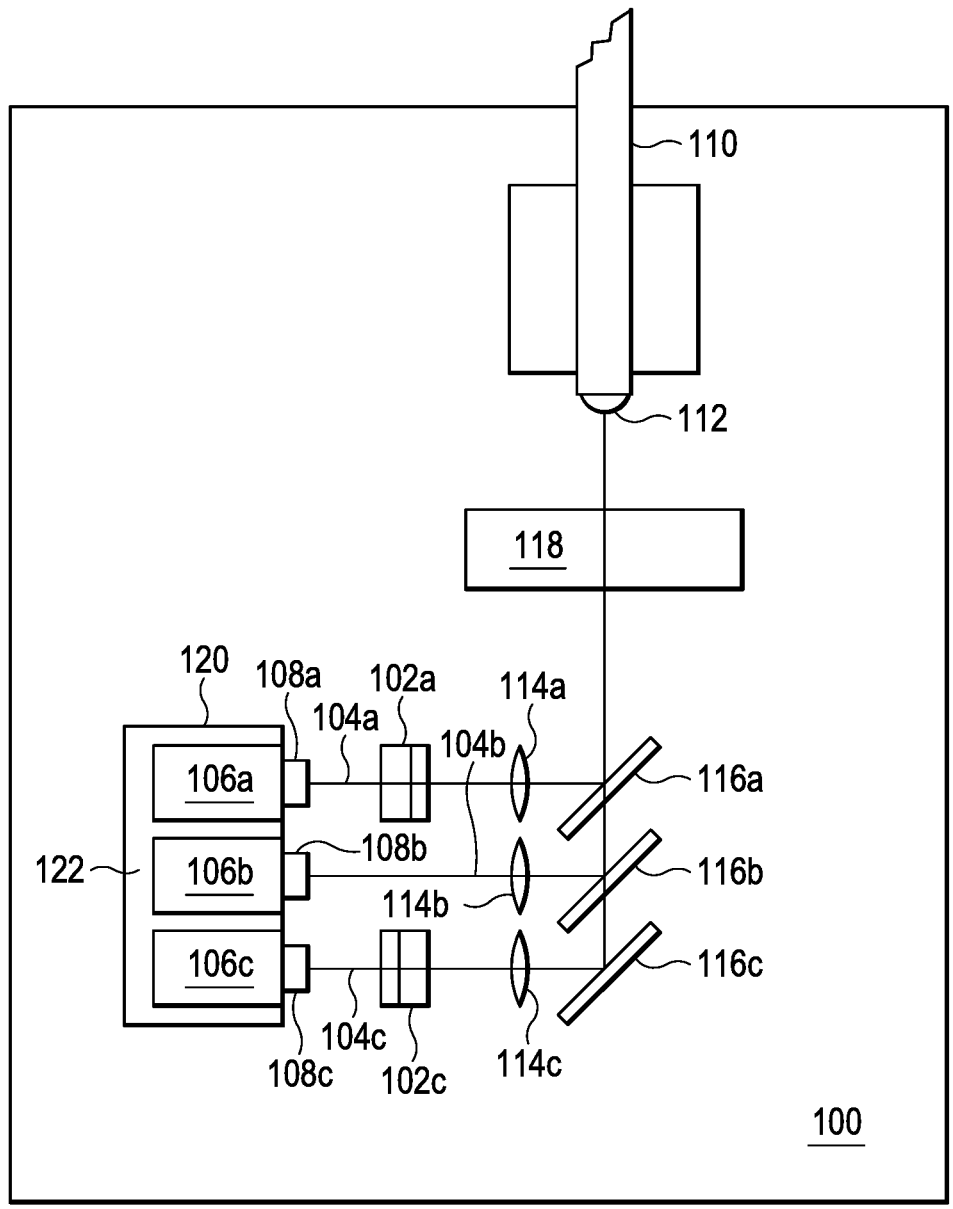
FIG. 1A is a plan view illustrating a representative laser diode package including a plurality of beam offset plates according to various embodiments.

"Brightness" refers herein to the power of the laser diode or laser module divided by the BPP-squared.

"Downstream" is a relative term that refers herein to an item and/or process positioned farther along a light path than a reference item and/or process.

"Fast Axis" (FA) refers herein to the light emitted into the Y-Z plane of the laser diode.

"Fast Axis Collimator (FAC) Lens" refers herein to the cylinder lens used to collimate the fast axis of the laser diode.

"Light path" refers herein to the path that light takes in traversing an optical medium or system.

"Numerical Aperture" (NA) refers herein to the angle of the light incident upon a fiber, or exiting the laser diode, calculated by taking the sine of ½ the divergence or ½ the convergence.

"Objective Lens" refers herein to the lens or lenses used to launch the light into the optical fiber.

"Optical axis" refers herein to an imaginary line that defines the path along which light propagates through the system, up to first approximation. For a system composed of simple lenses and mirrors, the axis passes through the center of curvature of each surface, and coincides with the axis of rotational symmetry. For non-rotationally symmetric optical systems, each plane may be defined to have its own optical axis.

"Slow Axis" (SA) refers herein to the light emitted into the X-Z plane of the laser diode.

"Slow Axis Collimator (SAC) Lens" refers herein to a cylinder lens used to collimate the slow axis of the laser diode.

"Thermal conductivity" (TC) refers herein to the ability of a material to transfer heat across the material.

"Upstream" is a relative term that refers herein to an item and/or process positioned before another item and/or process along the light path in the direction light is traveling along the light path.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

DETAILED DESCRIPTION

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

Disclosed herein are optical systems that can be used to alter the spacing and/or orientation of optical beams propagating in a laser diode package. Such optical systems direct stacked laser beams produced by laser diode arrays onto an optical waveguide. Input beams or beam stacks and associated output beams or beam stacks propagate along parallel axes. In many practical examples, multiple laser beams propagate in a beam stack in which the laser beams are aligned in regular one-dimensional or two-dimensional arrays. However, beam stacks can include a plurality of irregularly arranged laser beams along one or two axes. Disclosed optical systems include one or more beam offset plates used to steer laser beams along different axes. Beam offset plates alter beam spacing in a fast-axis perpendicular to an optical axis (or path) by introducing vertical displacement of beams passing through the beam offset plate. The beam offset plate may be a tilted plane parallel plate or other optical element configured to vertically offset an optical beam. A tilted plane parallel plate may be tilted at shallow angles in order to offset a beam transmitting therethrough by a small amount for example, by 0.45 mm. The offset distance of a beam transmitting through a tilted plane parallel plate is associated with the angle of incidence of the beam and the thickness of the plate. The offset beams are then directed to additional optics to combine and focus the beams onto a target. Combined beams can be directed to a variety of targets such as an optical fiber so as to have a focused beam diameter and numerical aperture that correspond to fiber core diameter and numerical aperture. In typical examples, combined beams are directed into an optical fiber such as a 105 μm core diameter optical fiber, but various sizes and types of fibers or other optical waveguides can be used.

A variety of materials can be used to manufacture a beam offset plate, including optical glasses, plastics, fused silica or other transparent crystalline or non-crystalline materials. Dispersion and absorption tend to be of concern in the disclosed optical systems. In some applications, the beam offset plates are to be used with a range of wavelengths, and a material is selected for satisfactory performance over the wavelength range. For such applications, the use of a high index glass to reduce aberrations may need to be balanced against glass dispersion and absorption. Therefore, an optical material for a beam offset plate is generally selected to have a relative high index of refraction (typically between 1.4 and 1.9 for wavelengths between 350 nm and 2000 nm and an Abbe value between 85 and 25) to reduce aberration, dispersion and/or absorption.

As noted above, in some applications, a beam offset plate is used with a range of wavelengths, and a high refractive index may be balanced with an associated Abbe number suited to reduce dispersion and absorption. However, generally any optical glass can be used as may be convenient.

For the sake of simplicity and clarity, in many of the following examples only one or two beam offset plates are shown in various configurations or laser package assemblies. However, various numbers of beam offset plates, tilted to various angles, having various thicknesses, made of a variety of materials, used in a variety of combinations are contemplated and are within the scope of the invention. Therefore, claimed subject matter is not limited in this regard.

FIG. 1A is a plan view illustrating a representative laser diode package 100 according to various embodiments. Package 100 is configured to focus a plurality of laser beams onto an input facet 112 of an optical fiber 110. Laser diode package 100 may be a pump for a high-power fiber laser and may generate a significant amount of heat. Laser diode package 100 is configured to reduce the thermal path away from the laser diodes to improve performance and/or reliability of package 100 by lowering the operating temperature and thus reducing the negative impact of heat on the operation of the diodes in package 100.

Laser diode package 100 includes diodes 106a-c configured to emit laser beams 104a-c. To reduce the thermal path away from laser diodes, diodes 106a-c are mounted on a surface of a substrate 120. Substrate 120 is a planar structure rather than the stairstep structure found in conventional laser diode packages.

A laser diode typically emits laser radiation from a facet that is much longer in one direction than in an orthogonal direction so that the emitted laser radiation has a smaller divergence in a direction parallel to the longer facet dimension and a larger divergence in a direction parallel to the smaller facet dimension. An axis parallel to and along the longer facet dimension is referred to as a "slow axis;" an axis parallel to and along a smaller facet dimension is referred to as a "fast axis." Herein the fast axis is perpendicular to surface plane 122 of substrate 120 and is therefore also referred to as the "vertical axis." Fast axis collimating (FAC) lenses 108a-c are configured to collimate laser beams 104a-c in the vertical or fast axis. Slow axis collimating (SAC) lenses 114a-c are configured to collimate laser beams 104a-c in the horizontal or slow axis.

Because diodes 106a-c are disposed at substantially the same height and are not vertically offset by a stairstep substrate, laser beams 104a-c will be emitting in the same plane. Without vertical offset of laser diodes 106a-c, clipping of laser beams 104a-c may occur when turned 90° by turning mirrors 116a-c. Beam clipping may be caused by an obstruction that interferes with transmission of a beam reducing beam quality, causing distortion and/or optical loss. In an example, beam offset plates (BOP) 102a and BOP 102c are disposed between respective FAC lens and SAC lens pairs. To prevent clipping of laser beams 104a-c, BOP 102a and BOP 102c are configured to offset laser beams 104a and 104c vertically in order to stack them in the fast axis. The vertical displacement of laser beam 104a may be reduced by refraction through BOP 102a; the vertical displacement of the laser beam 104b may be increased by passing through BOP 102c. By lowering the vertical displacement of beam 104a, not changing the vertical displacement of beam 104c and increasing the vertical displacement of beams 104b laser beams 104a-c can be stacked in the vertical axis as if laser diodes 106a-c were disposed on a stairstep substrate.

Figure 1B:
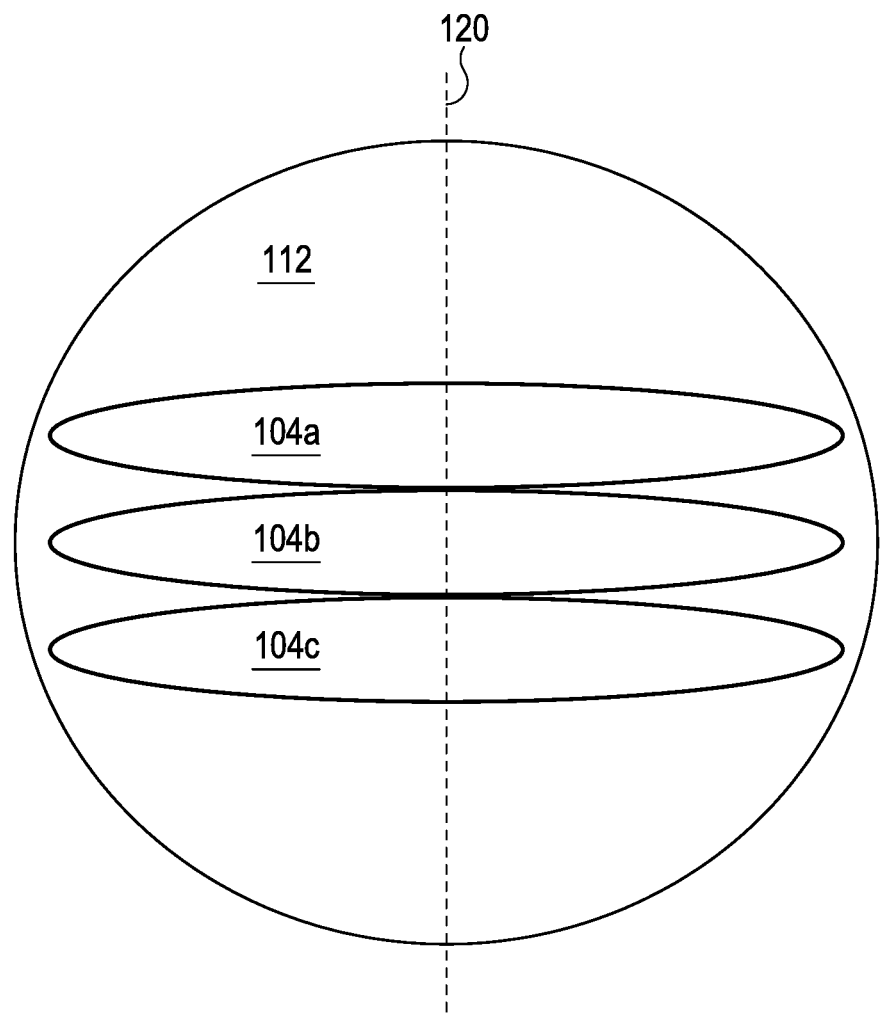
FIG. 1B is a cross-sectional view of beams shown in FIG. 1A.

FIG. 1B is a cross-sectional view illustrating laser beams 104a-c incident upon fiber input facet 112 (see FIG. 1A) of fiber 110 in laser diode package 100. Laser beams 102a-c are stacked in the vertical axis 120 due to translation by BOP 102a and BOP 102b. Thus, a stairstep carrier plate is not needed in order to focus laser beams 102a-c into fiber 110.

Figure 2A:
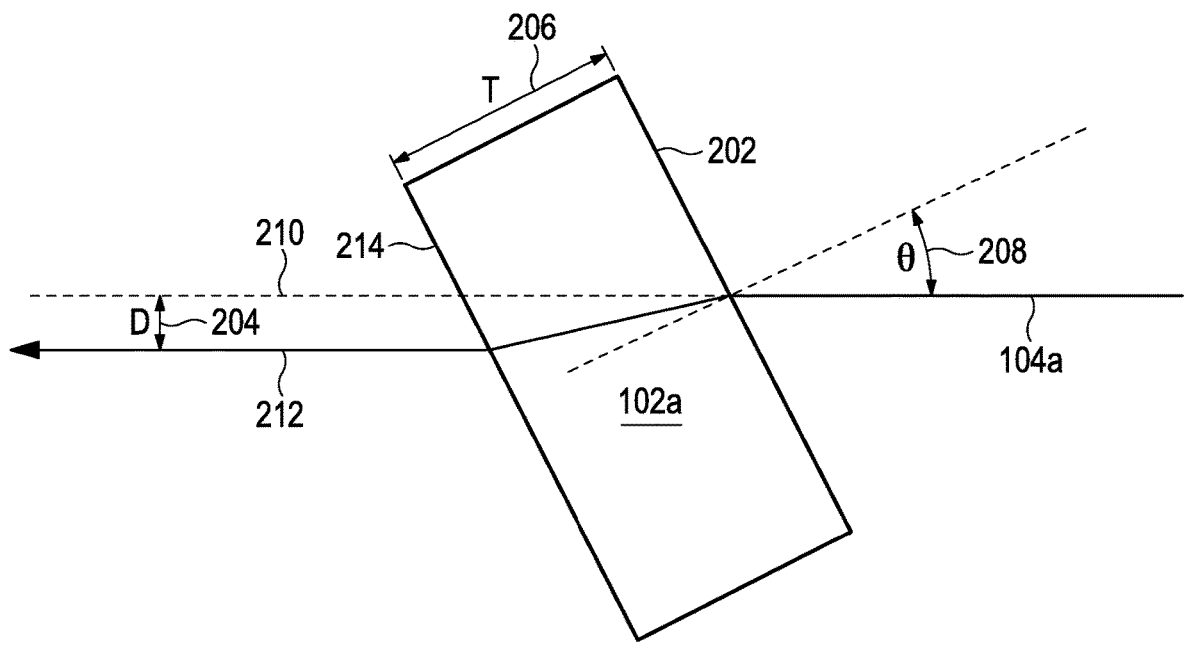
FIG. 2A is a side view illustrating an optical beam path transmitted through a beam offset plate according to various embodiments.

FIG. 2A is a side view illustrating BOP 102a (shown in FIG. 1). BOP 102a may comprise a tilted parallel plate having an input surface 202 parallel to an output surface 214. An input optical path of laser beam 104a can be vertically offset by transmitting laser beam 104a through BOP 102a. In an example, the vertical translation may displace beam 104a below an initial optical axis 210 to a subsequent optical axis 212 by refraction. Using input optical axis 210 as a reference plane, because the index of refraction of tilted parallel plate 102a is higher than the index of refraction from which laser beam 104a transitions, positive tilt angle 208 displaces the beam below input optical axis 210. As illustrated in Equation 1, the amount of offset, measured as distance D 204, is related to the thickness of the tilted parallel plate, T in 206, and the tilt angle θ 208.

$$D = T\sin(\theta)\left(1 - \frac{\cos\theta}{\sqrt{n^2 - \sin^2(\theta)}}\right) \quad \text{Equation 1}$$

Figure 2B:
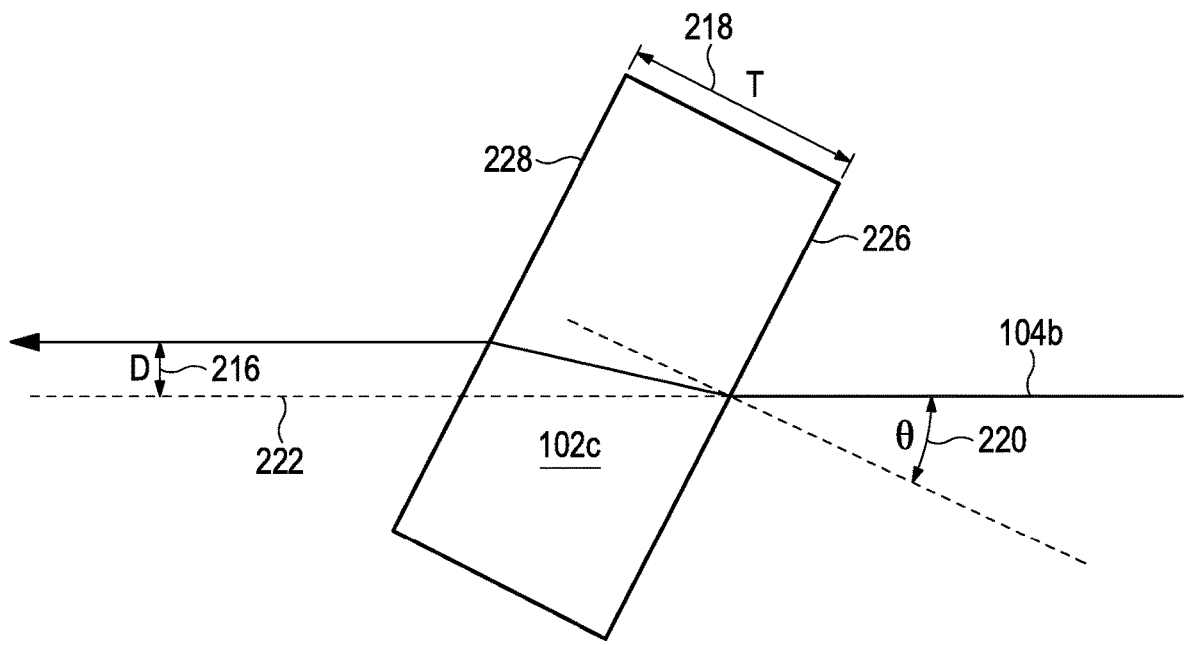
FIG. 2B is a side view illustrating an optical beam path transmitted through a beam offset plate according to various embodiments.

Vertical translation of the beam above an input optical axis is possible. For example, FIG. 2B is a side view illustrating BOP 102c (shown in FIG. 1). BOP 102c may be a tilted parallel plate having an input surface 226 parallel to an output surface 228. An input optical path 222 of laser beam 104b is vertically offset by distance D 216 (again related to the thickness of the tilted parallel plate, T 218, and tilt angle θ 220). The vertical translation here displaces beam 104b above input optical axis 222. Using input optical axis 222 as a reference plane, because the index of refraction of tilted parallel plate 102c is higher than the refractive index of the medium from which laser beam 104c transitions, negative tilt angle θ 220 displaces the beam 104c above input optical axis 222.

Beam offset plates 102a and/or 102c are configured to be disposed in laser diode packages optimized for power while constraining footprint. In some cases, the laser diode packages will be retrofit with BOP 102a and/or 102b. In an example, BOP 102a and/or 102b may be positioned between an existent FAC lens and a SAC lens within a given laser package. An intermediary beam offset plate will change the optical path seen by the SAC lens requiring the SAC lens to be repositioned. In order to retrofit such a laser diode package the beam offset plate may be designed so as to minimize the change in optical path seen by the SAC lens. Therefore, BOP 102a and/or 102b may need to be optimized to minimize thickness and tilt angle by, for example, selecting glass having an Index of Refraction and Abbe number that minimizes dispersion and absorption to avoid increasing the package footprint.

Figures 3A, 3B:
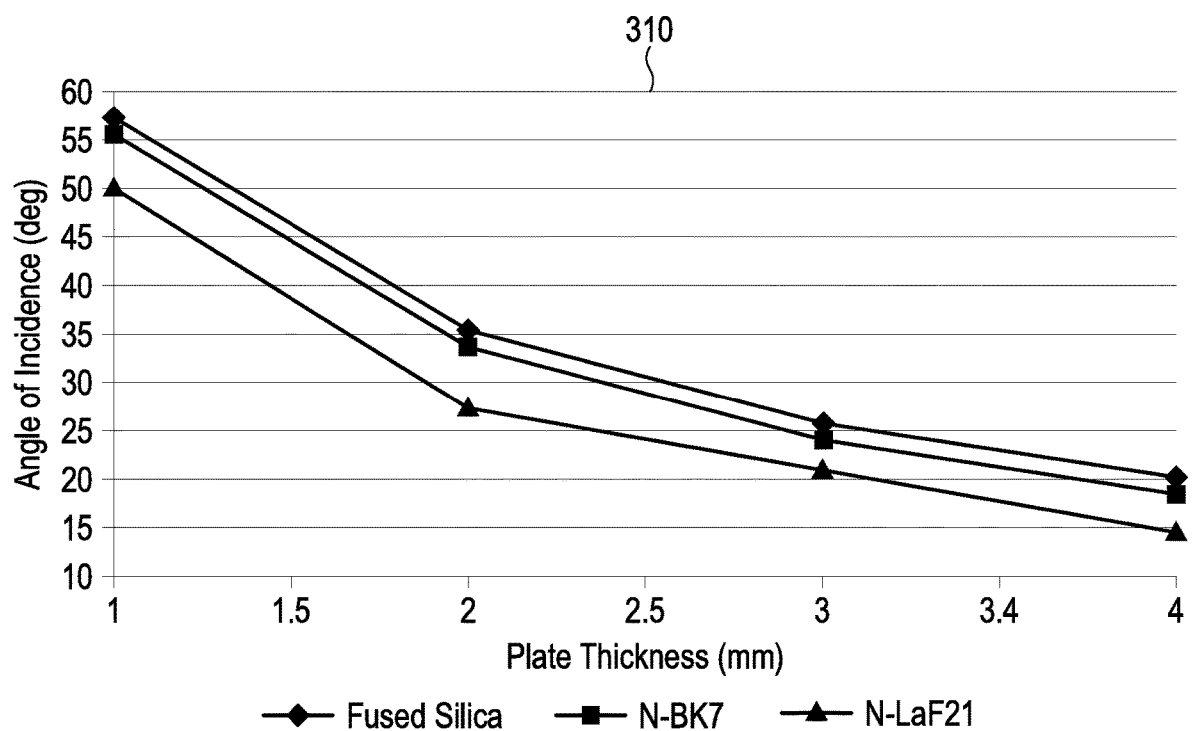
FIG. 3A is a table showing various example thicknesses of various glasses that can be used in a beam offset plate to translate an optical beam 0.45 mm.
FIG. 3B is a graph plotting angle of incidence versus material thickness selected to translate an optical beam 0.45 mm.

FIG. 3A is a table 300 showing various example thicknesses and angles of incidence of different glasses that can be used in a beam offset plate to translate an optical beam 0.45 mm at a wavelength of 920 nm in a laser diode package. Fused silica, N-BK7 and N-LaF21 are popular and readily available glass materials.

FIG. 3B is a graph 310 plotting the data in table 300. As is readily apparent from the graph the angle of incidence decreases as material thickness increases. Material thicknesses were selected to translate an optical beam 0.45 mm at a wavelength of 920 μm in a laser diode package. The Abbe number of a material quantifies the amount of dispersion in a given spectral range. Fused silica has an Abbe number 67.82, N-BK7 has an Abbe number of 64.2 and N-LaF21 has an Abbe number of 47.49. N-LaF21 might be selected to use where the architecture of the package has very little opto-mechanical adjustment and so the design constraints do not permit a thick substrate or large tilt angles.

Figure 4A:
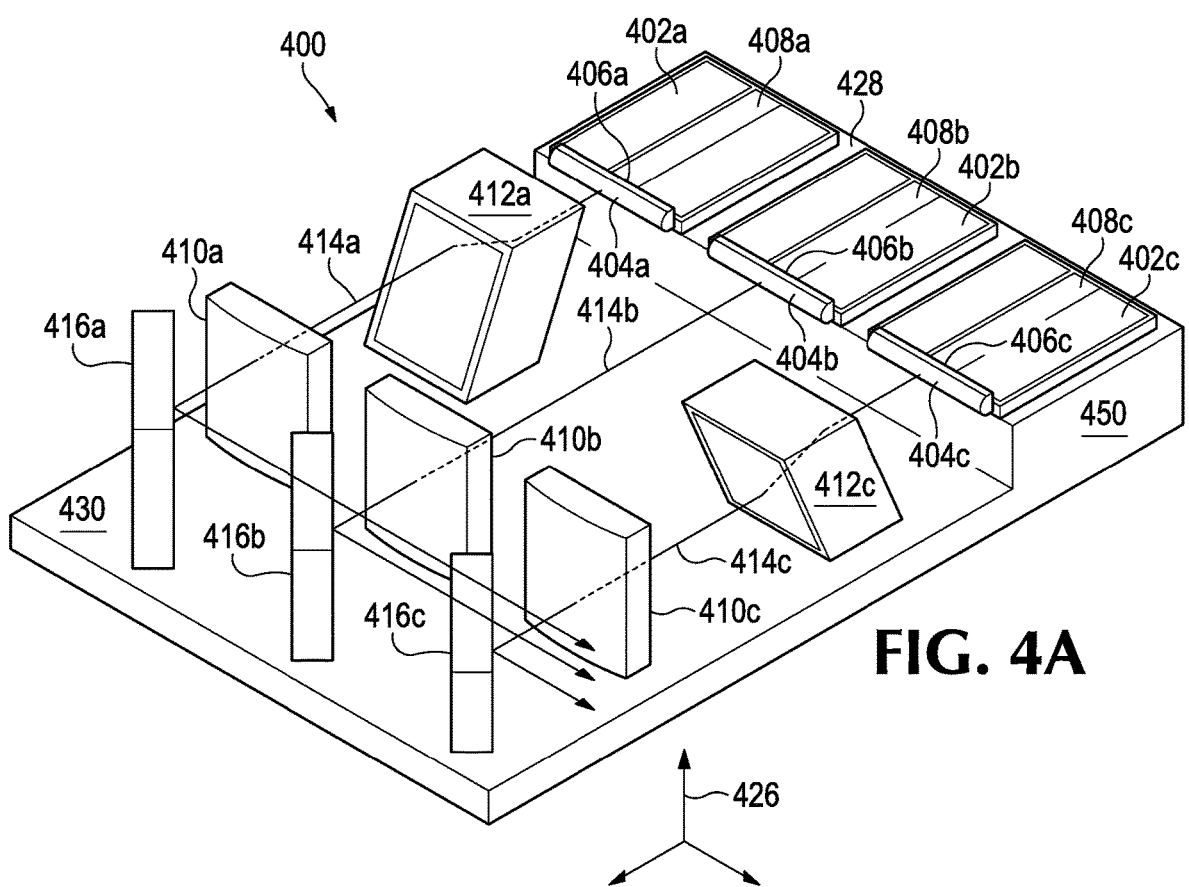
FIG. 4A is a perspective view illustrating a representative laser diode package including a plurality of beam offset plates according to various embodiments.

FIG. 4A is a perspective view illustrating an example laser package assembly 400 incorporating a plurality of beam offset plates to steer laser beams onto an optical fiber input facet without using a stairstep carrier plate. Laser package 400 comprises laser diodes 402a-c each configured to emit a laser beam. Assembly 400 includes additional optical elements configured to direct laser beams toward additional optical systems such as subsequent laser package assembly, free-space optics, processing optics and/or one or more optical fibers 110 (shown in FIG. 1), or the like or any combination thereof. For example, waveguides 408a-c each generate and emit respective laser beams 414a-c from corresponding output facets 406a-c. FAC lenses 404a-c are positioned at output facets 406a-c. Waveguides 408a-c may be disposed on a raised planar surface 428. Surface 428 need not be raised may be flush with surface 430.

Laser beams 414a-c exit output facets 406a-c and are collimated in the fast (or vertical) axis 426 by FAC lenses 404a-c. Beam 414a-c are collimated in the slow (horizontal) axis by SAC lenses 410a-c. Prior to passing through respective SAC lenses 410a-c, laser beams 414a and 414c pass through BOP 412a and BOP 412c. BOP 412a vertically translates laser beam 414a above its original optical axis. BOP 412c vertically translates laser beam 414c below its original optical axis. Laser beam 414b propagates through free space and thus generally maintains an undisrupted horizontal beam path. BOP 412a is configured to offset laser beam 414a in the vertical axis above laser beam 414b and laser beam 414c. BOP 412c is configured to vertically offset beam 414c in the vertical axis below laser beam 414a and laser beam 414b. After beams 414a-c pass through respective SAC lenses 410a-c, turning mirrors 416a-c direct the vertically offset laser beams 414a-c through a beam focusing optic such as objective lens 118 (shown in FIG. 1A) which focuses the beams onto an input surface of a waveguide such as input facet 112 of fiber 110 (see FIG. 1B). Using BOPs 412a and 412c enables stacking beams 414a-c in the fast axis by mirrors 416a-c and objective lens 118 without the need to position laser diodes 402a-c on increasingly elevated planes or stair steps.

Because mechanical stair steps are no longer necessary to stack the beams in the vertical axis, a carrier 450 comprising a single machined module may be provided for attaching or mounting diodes and optics of laser package 400. Unlike conventional laser diode packages having separate carrier and submount components that need to be soldered together, carrier 450 can be manufactured from a single piece of thermally conductive material, thereby reducing cost and complexity by eliminating one or more manufacturing steps. Carrier 450 may be a cooling block and may comprise a variety of thermally conductive materials such as copper, copper-tungsten alloy, aluminum or other metals or high thermal conductivity ceramics such as, but not limited to, BeO, AlN, or the like or any combination thereof. With simplification of manufacturing of carrier 450, more expensive or difficult to machine materials may be feasibly selected for use as a carrier 450. Such materials may include thermal pyrolytic graphite (TPG) and/or silicon carbide (SiC)). Carrier 450 may also be any of a variety of shapes depending on the number and architecture of optical components mounted thereon. For example, carrier 450 may have an elevated plane upon which laser diodes are mounted. In another example, carrier 450 may be a single plane (see FIG. 6). Laser package assembly 400 is merely an example of a laser diode package having a planar carrier and submount including multiple beam offset plates to vertically translate laser beams without the need for vertical displacement of the laser diode themselves for facilitating improved thermal efficiencies while maintaining the ability to couple the beams onto a waveguide input facet with minimal distortion and/or optical loss (due to clipping). A variety of other diode package configurations varying in number and type of optical elements are possible and claimed subject matter is not so limited. For example, laser assembly may include only one beam offset plate.

Figure 4B:
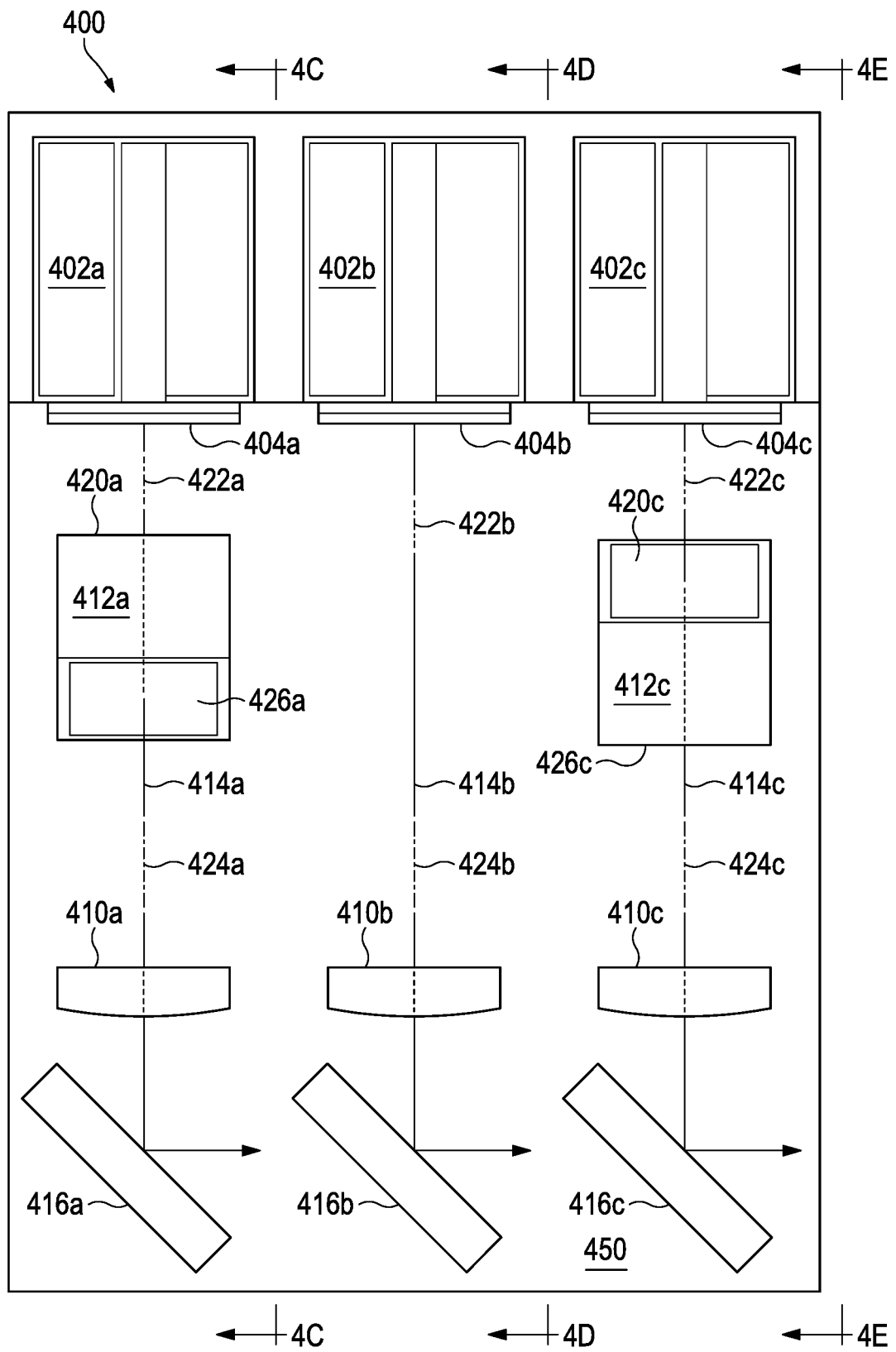
FIG. 4B is a plan view illustrating a representative laser diode package including a plurality of beam offset plates according to various embodiments.

FIG. 4B is a plan view illustrating representative laser diode package 400 including a plurality of beam offset plates 412a and 412c configured to enable stacking of laser beams 414a-c in the vertical axis. BOP 412a is configured to receive laser beam 414a on a first input surface 420a in line with an input optical axis 422a. Input surface 420a and output surface 426a may be coated with an anti-reflection coating. As beam 414a passes through BOP 412a, BOP 412a translates beam 414a by refraction in the vertical axis to an output optical axis 424a which is vertically higher than input axis 422a. Input optical axis 422 a and output optical axis 424a are both perpendicular to the vertical axis.

BOP 412c is configured to receive laser beam 414c on a first input surface 420c in line with an input optical axis 422c. Input surface 420c and output optical surface 426c may be coated with an anti-reflection coating. As beam 414c passes through BOP 412c, BOP 412c translates beam 414c in the vertical axis to an output axis 424c which is vertically lower than input axis 422c. Input optical axis 422c and output optical axis 424c are both perpendicular to the vertical axis.

FIG. 4C is a cutaway view illustrating a side profile of optical beam 414a transmitting through BOP 412a in laser package assembly 400 (see FIG. 4A). Beam 414a is emitted by laser diode 402a and collimated by FAC lens 404a. Beam 414a travels along optical axis 422a and enters BOP 412a on an angled input surface 420a. Beam 414a is refracted through BOP 412a exiting BOP 412a though angled output surface 426a along optical axis 424a. Angled input surface 420a and angled output surface 426a are parallel to one another. Optical axis 424a is higher in the vertical direction than optical axis 422a a distance D 432.

FIG. 4D is a cutaway view illustrating a side profile of optical beam 414b emitted by laser diode 402b laser package assembly 400 (see FIG. 4A). Beam 414b travels along optical path 422b substantially undisrupted.

FIG. 4E is a cutaway view illustrating a side profile of optical beam 414c transmitting through BOP 412c in laser package assembly 400 (see FIG. 4A). Beam 414c is emitted by laser diode 402c and collimated by FAC lens 404c. Beam 414c travels along optical axis 422c and enters BOP 412c on an angled input surface 420c. Beam 414c is refracted through BOP 412c exiting BOP 412c though angled output surface 426c along optical axis 424c. Angled input surface 420c and angled output surface 426c are parallel to one another. Optical axis 424c is lower in the vertical direction than optical axis 422c by a distance D 430. BOP 412a and BOP 412c may be substantially identical and positioned within laser package assembly 400 oriented 180° with respect to one another.

Use of the beam offset plates to steer the beams in the diode package can potentially reduce the overall cost of the package, has overall tighter tolerances than machined parts and their mechanical stack up of machining tolerances, reduces the thermal path from the submount to the base of the package, can enable changing the amount of beam offset for different configurations without affecting the thermal path, and due to the simplicity of the submount and carrier scheme more exotic materials may be used that may have much higher thermal conductivity than copper or copper tungsten alloy, but which were previously prohibitively expensive due to manufacturing costs and the stairstep configuration.

Additional architectures using beam offset plates to steer beams within a laser diode package are contemplated and within the scope of the claimed subject matter. A nonexhaustive listing of additional examples are provided below.

Figure 5A:
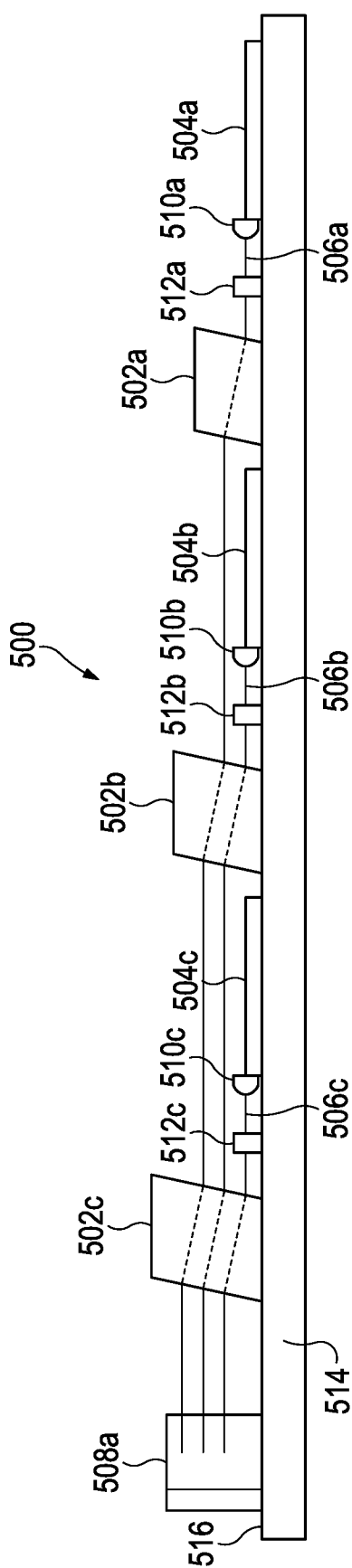
FIG. 5A is a perspective view illustrating a representative laser diode package including a plurality of beam offset plates inline according to various embodiments.

FIG. 5A is a cutaway view illustrating a representative laser diode package 500 including a plurality of BOPs 502*a-c* disposed in line with multiple laser diodes 504*a-c* such that successive downstream BOPs 502*b-c* steer a plurality of laser beams 506*a-c* toward mirror 508*a*.

In an example, laser beams 506*a-c* are emitted from respective laser diodes 504*a-c* and are each collimated in the fast axis by FAC lenses 510*a-c* and in the slow axis by SAC lenses 512*a-c* prior to entering BOPs 502*a-c*. BOP 502*a* translates a single laser beam 506*a* higher in the vertical axis with respect to a surface plane 516 of carrier 514, so that the optical path of laser beam 506*a* will pass over downstream optics, including laser diode 504*b*, FAC lens 510*b* and SAC lens 512*b*. BOP 502*b* translates both laser beams 506*a* and 506*b* higher in the vertical axis so that the optical path of laser beams 506*a* and 506*b* will pass over laser diode 504*c*, FAC lens 510*c* and SAC lens 512*c*. BOP 502*c* directs all three laser beams 506*a-c* to turn mirror 508*a*.

Figure 5B:
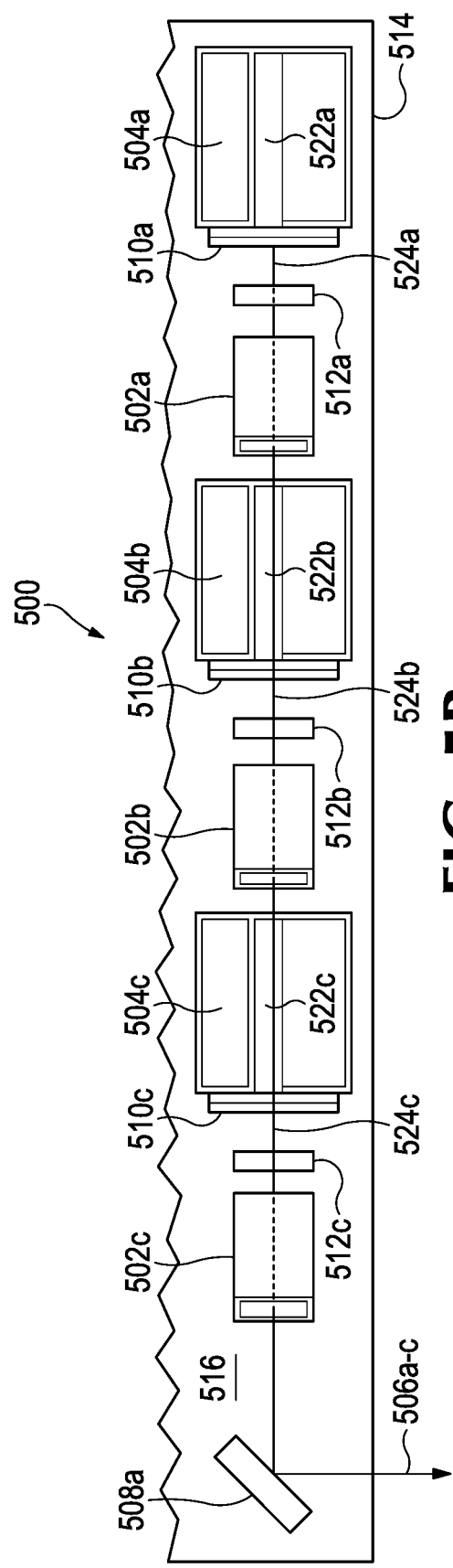
FIG. 5B is a cutaway view illustrating a side profile of a plurality of optical beams transmitting through a plurality of beam offset plates inline according a representative laser diode package according to various embodiments.

FIG. 5B is a plan view of laser diode package 500 including in line BOPs 502*a-c* for steering successive laser beams 506*a-c*. Waveguides 522*a-c* are aligned such that laser beams 506*a-c* are emitted in the same optical path 524*a-c*. As beams 506*a-c* are conditioned by various optics (e.g., FAC lenses 510*a-c* and SAC lenses 512*a-c*) in diode package 500 the optical path of laser beams 506*a-c* are overlaid in the horizontal direction and stacked in the vertical direction.

Carrier 514 may be provided for attaching or mounting optical components of laser diode package 500. Carrier 514 may be a cooling block and may comprise a variety of thermally conductive materials such as copper, copper-tungsten alloy, aluminum or the like or any combination thereof. Carrier 514 may comprise a stairstep configuration, wherein each stairstep has a subassembly of optical components mounted thereon.

Figure 5C:
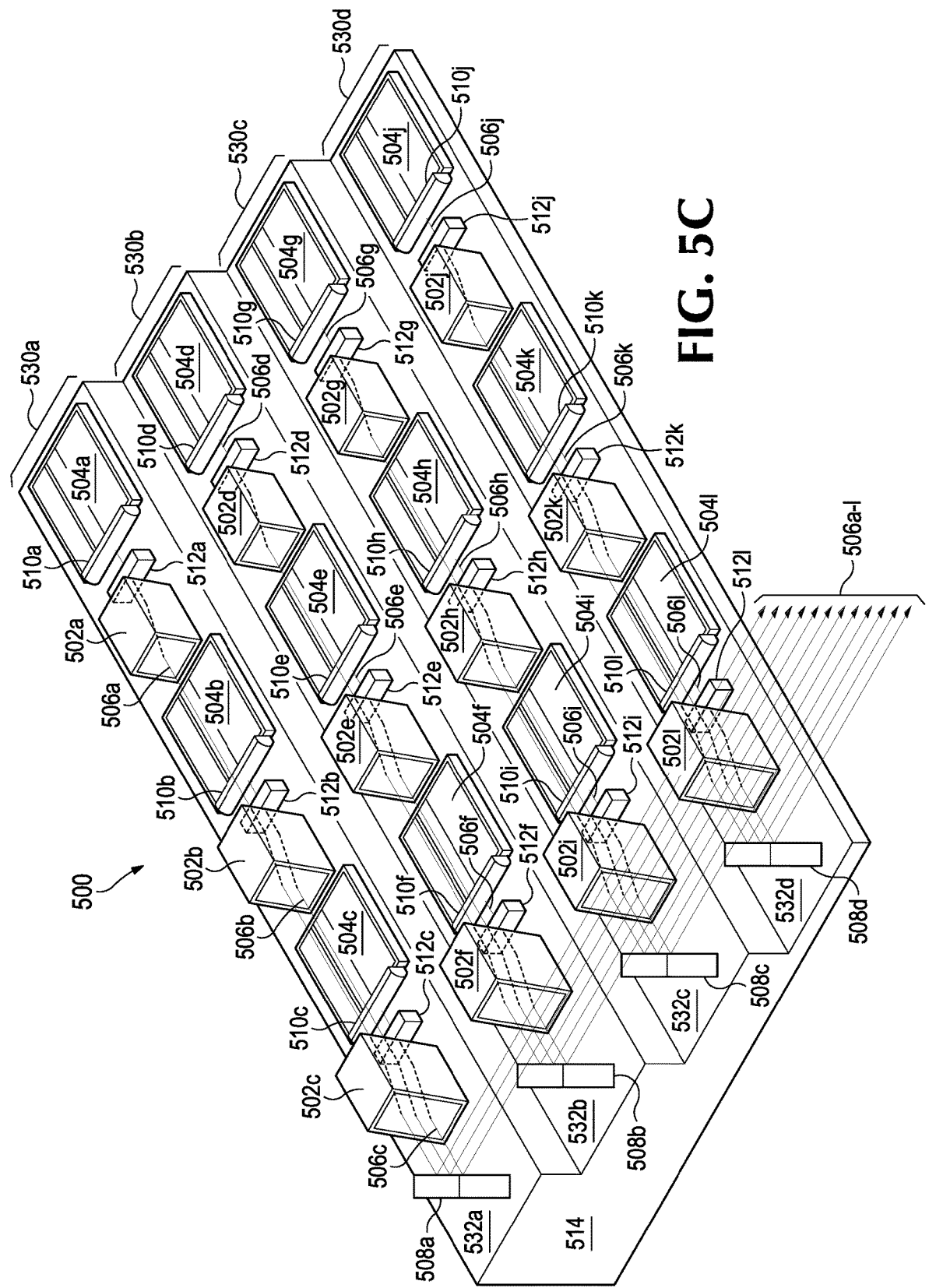
FIG. 5C is a plan view illustrating a plurality of optical beams transmitting through respective ones of an array of beam offset plates in a representative laser diode package according to various embodiments.

FIG. 5C is a perspective view illustrating a laser diode package 500 comprising a two-dimensional array of beam offset plates disposed on stairstep carrier 514 configured for stacking a plurality of laser beams 506*a*-1 in the vertical axis. Subassembly 530*a* includes laser diodes 504*a-c* which are configured to direct laser beams 506*a-c* through FAC lenses 510*a-c* and SAC lenses 512*a-c* to be collimated in the fast and slow axes, respectively. After collimation, laser beams 506*a-c* are stacked in the vertical axis by BOPs 502*a-c* and turned by mirror 508*a*. Likewise, subassemblies 530*b-d* are configured to stack beam sets 506*d-f*, 506*g-i*, and 506*k*-1 in the vertical axis. Each of subassemblies 530*b-d* are disposed on respective ones of carrier steps 532*b-d* so as to further stack beams sets 506*d-f*, 506*g-i*, and 506*k*-1 in the vertical axis substantially without clipping. Turn mirrors 508*a-d* may direct beams 506*a*-1 to a beam combining optic (see e.g., objective lens 118 in FIG. 1) to focus the beams onto the input facet of an optical fiber (see e.g., facet 112 of fiber 110).

Figure 6:
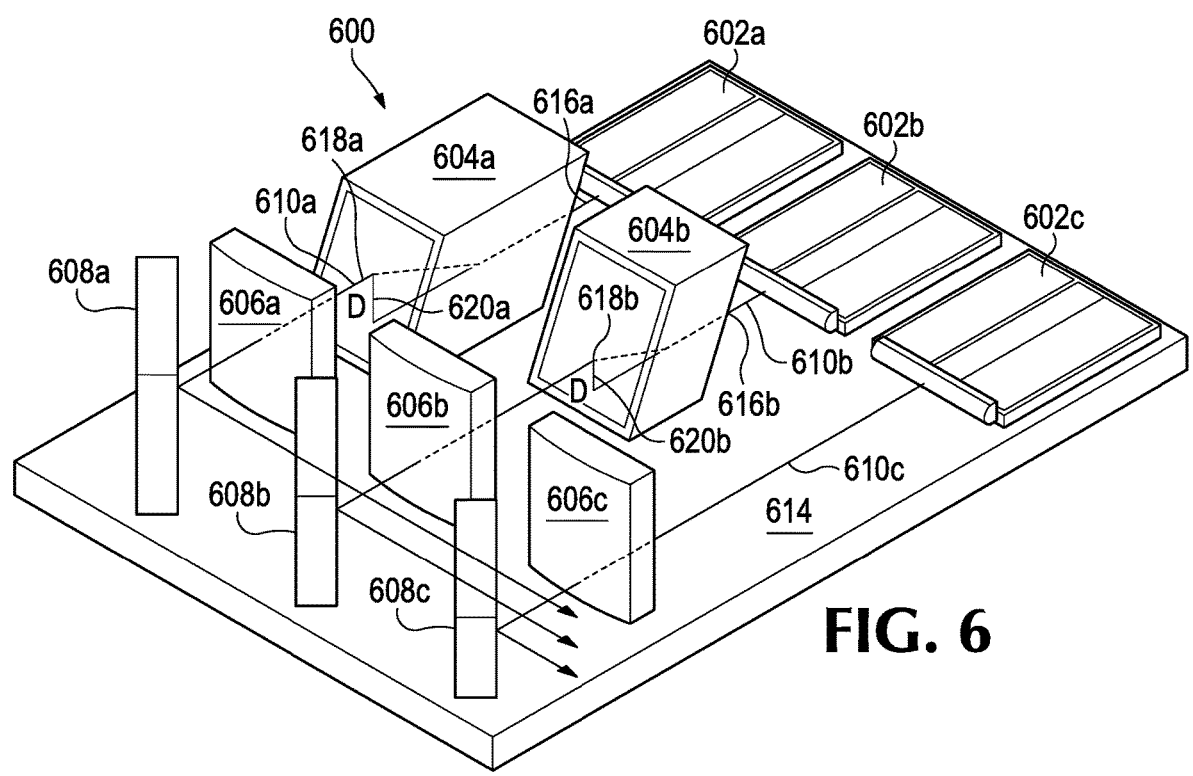
FIG. 6 is a perspective view illustrating a plurality of optical beams transmitting through a plurality of beam offset plates in a representative laser diode package according to various embodiments.

FIG. 6 is a perspective view illustrating a laser diode package 600 comprising a plurality of beam offset plates 604*a-b* for vertically offsetting laser beams 610*a-b*. In this example, carrier 614 is a single flat plane comprising a thermally conductive material. Laser diodes 602*a-c*, BOPs 604*a-b*, SAC lenses 606*a-c*, and turning mirrors 608*a-c* are all mounted on carrier 614, in the same plane. BOP 604*a* and BOP 604*b* are directly adjacent to one another in package 600. BOP 604*b* vertically translates beam 610*b* from an input optical axis 616*b* to a higher output optical axis 618*b* by distance D 620*b*. BOP 604*a* vertically translates beam 610*a* from an input optical axis 616*a* to a higher output optical axis 618*a* by a distance D 620*a*. Beam 610*c* is substantially undisrupted. Thus, beams 610*a-c* are vertically stacked. In this example distance D 620*a* is greater than distance D 620*b*. In other examples, two or more BOPs in a particular package made vertically translates optical beams the same distance.

Figure 7:
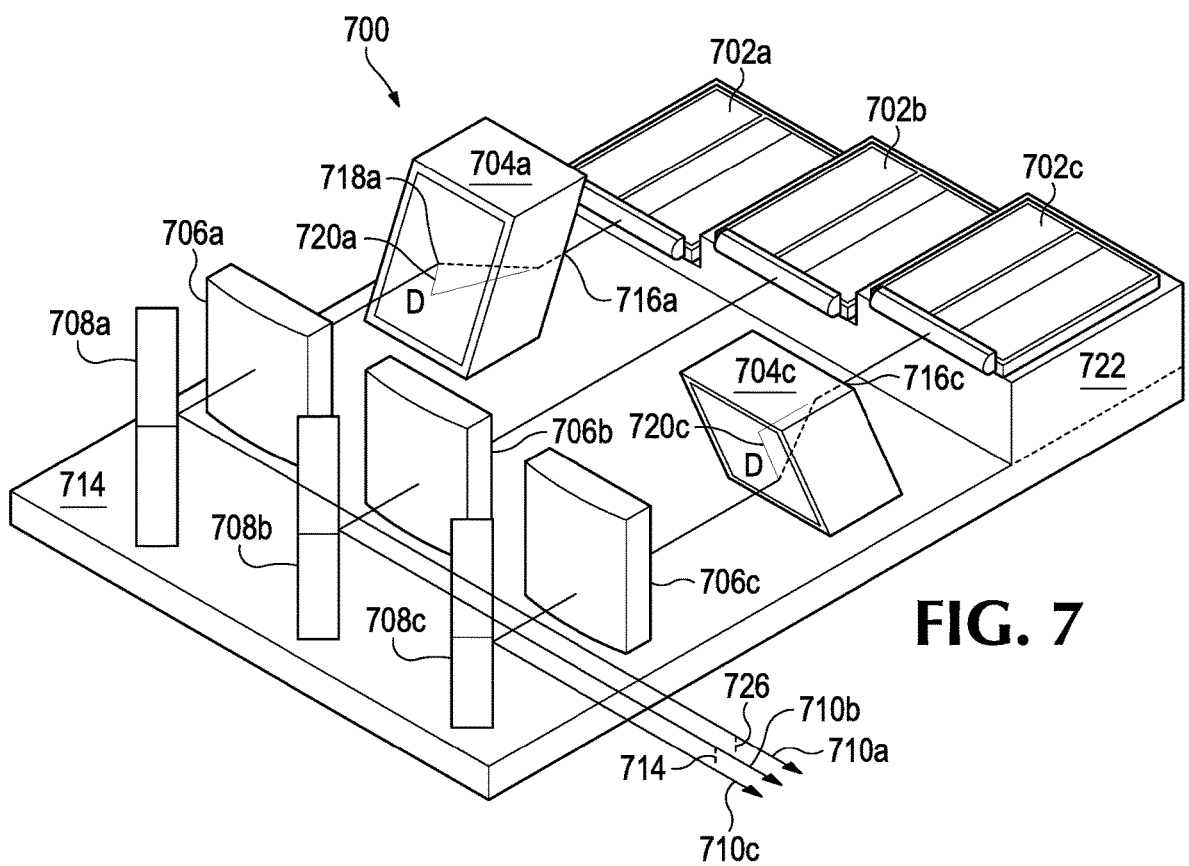
FIG. 7 is a perspective view illustrating a plurality of optical beams transmitting through a plurality of beam offset plates in a representative laser diode package according to various embodiments.

FIG. 7 is a perspective view illustrating a laser diode package 700 comprising a plurality of beam offset plates 704*a* and 704*c* for vertically offsetting laser beams 710*a* and 710*c*. In this example, carrier 714 has a stairstep submount 722 comprising a thermally conductive material. Laser diodes 702*a-c* are mounted on the stairstep submount 722. BOPs 704*a* and 704*b*, SAC lenses 706*a-c*, and turning mirrors 708*a-c* are all mounted on a lower portion of carrier 714, in the same plane. BOP 704*a* and BOP 704*c* are not directly adjacent to one another rather there are intermediary optical components between them (e.g., SAC 706*b* and diode laser 702*b*) in package 700. BOP 704*a* vertically translates beam 710*a* from an input optical axis 716*a* to a higher output optical axis 718*a* by distance D 720*a*. BOP 704*c* vertically translates beam 710*c* from an input optical axis 716*c* to a lower output optical axis 718*c* by a distance D 720*c*. Beam 710*b* is substantially undisrupted. Thus, beams 710*a-c* are vertically stacked. Distance D 720*a* may be different from distance D 720*c*. In this example including a stairstep submount, the motivation for using the BOPs may be to alter the offset 724 and/or 726 between beams 710*a-c* rather than to reduce the thermal path away from laser diodes 702*a-c*. BOPS tend to have overall tighter tolerances than machined parts (e.g., stairstep) which may permit optical designs that reduce offset between beams without limitations imposed by machining tolerances.

Figure 8:
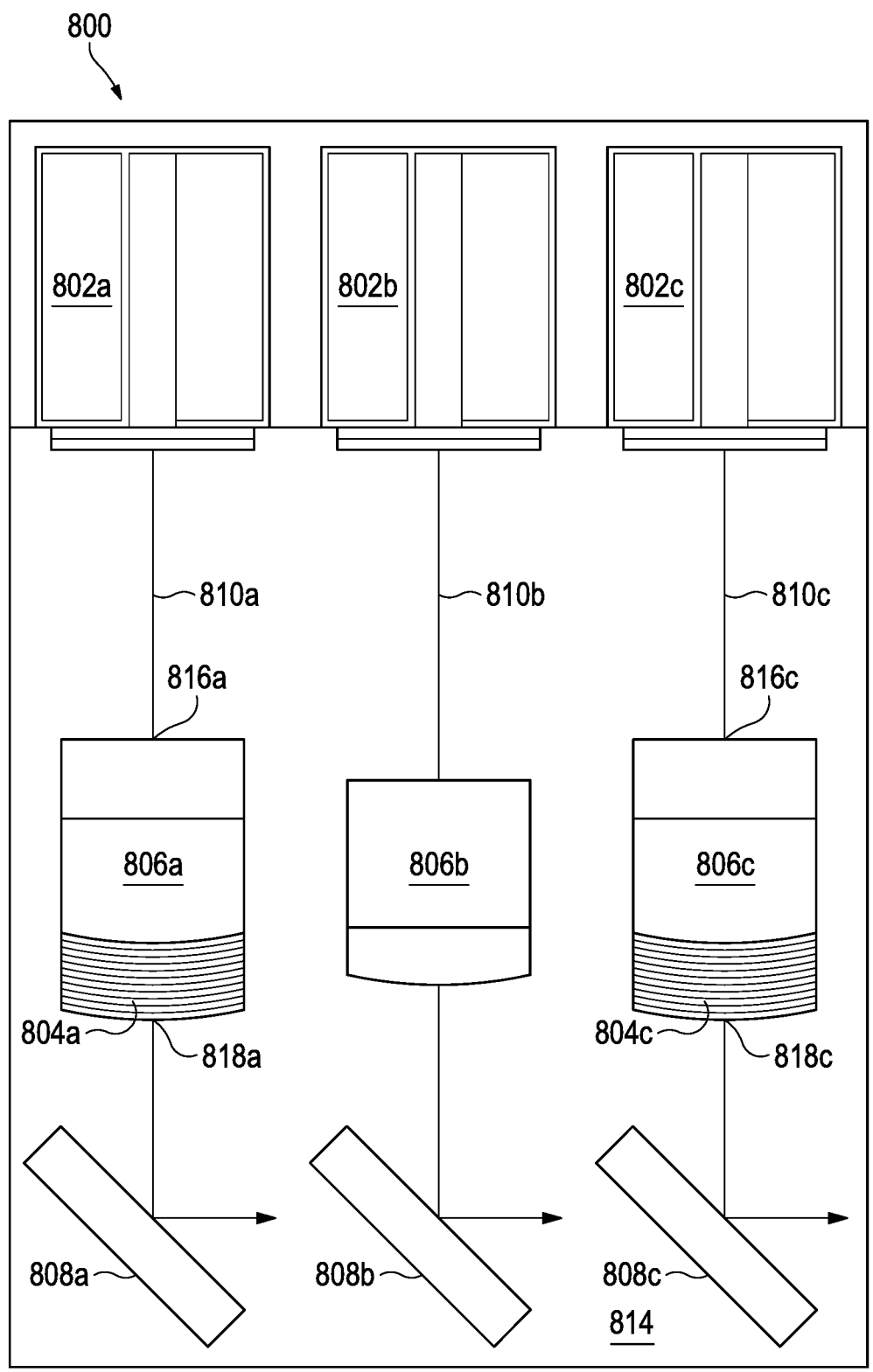
FIG. 8 is a plan view illustrating a plurality of optical beams transmitting through a plurality of beam offset plates coupled with slow axis collimating lenses in a representative laser diode package according to various embodiments.

FIG. 8 is a plan view illustrating a laser diode package 800 comprising a plurality of beam offset plates 804*a* and 804*c* combined with respective SAC lenses 806*a* and 806*c* for vertically offsetting laser beams 810*a* and 810*c*. In this example, carrier 814 is a flat plane without a stairstep submount. Laser diodes 802*a-c*, combine BOP/SAC lenses 806*a* and 806*c*, SAC lens 806*b*, and turning mirrors 808*a-c* are all mounted on carrier 814, in the same plane. Combine BOP/SAC lens 806*a* collimates and vertically translates beam 810*a* from an input optical axis 816*a* to a higher output optical axis 818*a*. Combine BOP/SAC lens 806*c* collimate and vertically translate beam 810*c* from an input optical axis 816*c* to a lower output optical axis 818*c*. Beam 810*b* is collimated by SAC lens 806*b* and is not translated in the vertical axis because it does not pass through a beam offset plate. In this way beams 810*aa-c* are vertically stacked. The distances combine BOP/SAC lenses translate respective laser beams 806*a* and 806*c* may be the same or different. In this example, an increased thickness of BOP/SAC lenses 806*a* and 806*c* may necessitate positioning lenses 806*a* and 806*c* farther away from the diode lasers 802*a* and 802*c* than the SAC lens 806*b*.

FIG. 9A illustrates an example of a set of beam offset plates 900 tilted in the same direction comprising a monolithic optical component including a base plate 902 and BOPs 904*a* and 904*b* (other numbers of BOPs may be placed on a base plate 902 to form the described set of BOPs and claimed subject matter is not limited in this regard). BOP set 900 can be manufactured to be a single piece of glass by a variety of processes including molding, injection molding, etching, machining, polishing a monolithic source substrate, and/or various other shaping methods or any combination thereof. Alternatively, a single BOP can be fabricated from multiple smaller optics assembled into a single optic. FIG. 9B illustrates an example of a set of beam offset plates 910 tilted in opposite directions comprising a monolithic optical component including a base plate 906 and BOPs 908*a* and 908*b*. BOP set 910 can be manufactured according to various embodiments described above.

Use of a monolithic BOP set such as set 900 or 910 may improve passive alignment of BOPs by having the BOPs 904*a-b* and/or 908*a-b* in fixed positions relative to one another as well as being fixed on a plate for placement within the optical systems where they will be in operation. Moreover, fixed BOPs 904*a-b* and/or 908*a-b* may enable assembly and BOP design optimized so that the angle of incidence of the BOP is Brewster's angle, omitting the need for anti-reflection coatings. Such a design for Brewster's angle using Fresnel's Law of reflections may eliminate the need for anti-reflective coating when using p-polarized light.

Having described and illustrated the general and specific principles of examples of the presently disclosed technology, it should be apparent that the examples may be modified in arrangement and detail without departing from such principles. We claim all modifications and variation coming within the spirit and scope of the following claims.

The invention claimed is:

1. A laser diode assembly, comprising:
    a plurality of laser diodes arranged on a first plane of a carrier plate, each configured to emit respective ones of a plurality of laser beams along parallel and nonoverlapping optical axes;
    a first beam offset plate (BOP) disposed on a second plane of the carrier plate, configured to receive a first of the laser beams on a first input surface, the first laser beam having a first input optical axis, the first BOP configured to transmit a first output laser beam that has a first vertical offset from the first input optical axis; and
    a second BOP disposed on a second plane of the carrier plate, configured to receive a second of the laser beams on a second input surface, the second laser beam having a second input optical axis, the second BOP configured to transmit a second output laser beam that has a second vertical offset from the second input optical axis, wherein the first plane is elevated with respect to the second plane wherein the first BOP or the second BOP or a combination thereof comprise a tilted parallel plate having an index of refraction between 1.4 and 1.9 such that the thickness of the tilted parallel plate is between a range of threshold thicknesses,
    wherein the first BOP or the second BOP or a combination thereof comprises an Abbe value between 85 and 25 and wherein the first and second BOPs are optimized so that the angle of incidence of each BOP is Brewster's angle.

2. The laser diode assembly of claim 1, wherein the first vertical offset of the first output laser beam is above the first input optical axis and wherein the second vertical offset of the second output laser beam is above the second input optical axis.

3. The laser diode assembly of claim 1, wherein the first vertical offset of the first output laser beam is below the first input optical axis and wherein the second vertical offset of the second output laser beam is below the second input optical axis.

4. The laser diode assembly of claim 1, wherein the first vertical offset of the first output laser beam is below the first input optical axis and wherein the second vertical offset of the second output laser beam is above the second input optical axis.

5. The laser diode assembly of claim 1, wherein the first BOP or the second BOP or a combination thereof are disposed adjacent to one or more optical elements configured to direct one or more of the laser beams along one or more light paths towards an input surface of an optical waveguide, free-space optics, second laser diode assembly, a different optical system or a combination thereof.

6. The laser diode assembly of claim 5, wherein the optical waveguide is an optical fiber.

7. The laser diode assembly of claim 1, wherein the plurality of laser diodes and the first BOP or the second BOP or a combination thereof are disposed on a same plane.

8. The laser diode assembly of claim 1, further comprising a fast axis collimating (FAC) lens disposed at an output facet of each of the plurality of laser diodes and a slow axis collimating (SAC) lens disposed downstream from each FAC lens and wherein the first BOP is disposed between a first FAC lens and a first SAC lens and wherein the second BOP is disposed between a second FAC lens and a second SAC lens.

9. The laser diode assembly of claim 8, wherein the first BOP, first FAC lens and first SAC lens subassembly are disposed adjacent to and parallel with the second BOP, second FAC lens and second SAC lens subassembly.

10. The laser diode assembly of claim 1, wherein the first BOP or the second BOP or a combination thereof comprises an optically transparent substrate.

11. The laser diode assembly of claim 10, wherein the optically transparent substrate is fused silica, N-BK7 or N-LaF21.

12. The laser diode assembly of claim 1, wherein the first vertical offset and the second vertical offset are the same.

13. The laser diode assembly of claim 1, wherein the first vertical offset and the second vertical offset are different.

14. The laser diode assembly of claim 1, wherein the first BOP or the second BOP, or a combination thereof is in contact with a slow axis collimating (SAC) lens.

15. The laser diode assembly of claim 1, wherein the first and second BOPs are formed from a single optical component.

16. The laser diode assembly of claim 1, wherein the first and second BOPs are fabricated from multiple smaller optics assembled into a single optic.

17. The laser diode assembly of claim 1, wherein the first and second BOPs are fabricated by molding, machining, or polishing a monolithic source substrate.

* * * * *